United States Patent [19]
Hashimoto et al.

[11] Patent Number: 6,067,310
[45] Date of Patent: May 23, 2000

[54] SEMICONDUCTOR LASER AND METHOD OF MAKING THE SAME

[75] Inventors: Jun-ichi Hashimoto; Michio Murata; Nobuyuki Ikoma; Jiro Fukui, all of Yokohama, Japan

[73] Assignee: Sumitomo Electric Industries, Ltd., Osaka, Japan

[21] Appl. No.: 08/924,502

[22] Filed: Sep. 5, 1997

[30] Foreign Application Priority Data

Sep. 6, 1996 [JP] Japan .................................. 8-237023

[51] Int. Cl.[7] ........................... H01S 3/19; H01L 21/20
[52] U.S. Cl. .............................. 372/49; 372/45; 438/29; 438/45
[58] Field of Search ................... 372/45, 46, 49; 438/29, 45

[56] References Cited

U.S. PATENT DOCUMENTS

| | | | |
|---|---|---|---|
| 4,282,494 | 8/1981 | Yonezu et al. | 372/46 |
| 4,309,668 | 1/1982 | Ueno et al. | 372/46 |
| 4,546,481 | 10/1985 | Yamamoto et al. | 372/48 |
| 4,942,585 | 7/1990 | Ungar | 372/44 |
| 4,964,135 | 10/1990 | Mitsui et al. | 372/46 |
| 5,045,500 | 9/1991 | Mitsui et al. | 438/33 |
| 5,144,634 | 9/1992 | Gasser et al. | 372/49 |
| 5,491,711 | 2/1996 | Mand et al. | 372/49 |
| 5,657,336 | 8/1997 | Okuyama et al. | 372/45 |

FOREIGN PATENT DOCUMENTS

6-5986  1/1994  Japan .

*Primary Examiner*—Rodney Bovernick
*Assistant Examiner*—Quyen P. Leung
*Attorney, Agent, or Firm*—Pillsbury Madison & Sutro LLP

[57] ABSTRACT

In the present method, at the time when a semiconductor laser is being made, nitrogen or phosphorus element is introduced into an active layer comprising a GaAs based compound from an end face thereof, thereby changing the region of the active layer in the vicinity of the end face into a GaN or GaP based compound. Accordingly, the energy band gap of this region is made wider than the energy band gap within the active layer, and thus substituted region is changed into a layer transparent to the laser light generated within the active layer. Thus, the end face can be prevented from deteriorating upon the temperature rise caused by laser light absorption at the end face.

2 Claims, 6 Drawing Sheets

SEMICONDUCTOR LASER AND METHOD OF MAKING THE SAME

BACKGROUND OF THE INVENTION

1. Field of the Invention

The present invention relates to a semiconductor laser used in the fields of optical communications, optical recording, optical information processing, and the like, and a method of making the same.

2. Related Background Art

In the field of long-distance optical communications, there has been a demand for semiconductor lasers which can continuously emit light for a long time with a high output. When a semiconductor laser having such a characteristic is available, the number of optical repeaters each containing the semiconductor laser therein can be reduced, and the semiconductor lasers may be replaced less frequently. However, it is difficult for the conventional semiconductor lasers to continuously emit light for a long time with a high output. One of the reasons thereof is the melting breakdown of the light-emitting end face upon a high output. This failure suddenly occurs during a high-output continuous light-emitting operation of the semiconductor laser, thereby causing a crucial damage to the semiconductor laser. Accordingly, it has been known as Catastrophic Optical Damage (COD). In particular, the COD frequently occurs in semiconductor lasers whose oscillation wavelength is 1.1 $\mu$m or shorter. While semiconductor lasers with an oscillation wavelength of about 0.98 $\mu$m has been expected to be utilized as a light source for optical fiber amplifiers such as EDFA (erbium-doped fiber amplifier), it is difficult for currently available semiconductor lasers in this oscillation wavelength region to continuously emit light for a long time with a high output, thus keeping long-distance optical communications by means of such optical fiber amplifiers from becoming practicable.

In order to suppress the COD, the density of nonradiative recombination centers between the end face of the semiconductor laser active layer and the reflecting layer may be lowered or restrained from increasing. In a so-called window structure, a semiconductor layer having a wide energy band gap, which is transparent to light of the oscillation wavelength, is formed on the above-mentioned end face and functions as a nonabsorptive region in the vicinity of the end face, thereby restraining the nonradiative recombination centers from increasing and the end face from deteriorating. Also, a current non-injectable region may be formed in the vicinity of the end face of the active layer so as to reduce the current leaking to the end face, thereby preventing the nonradiative centers from increasing at the end face. Further, as disclosed in the U.S. Pat. No. 5,144,634, there has been proposed a semiconductor laser whose end face is coated with a ultrathin film having a thickness of several nm.

Also, Japanese Patent Application Laid-Open No. 65986 discloses a method in which an element identical to that contained in the active layer is introduced through the end face thereof so as to render a higher resistivity to the end face.

In the semiconductor lasers with any of the configurations mentioned above, it is necessary to effect cleavage in a vacuum or provide the end face with an additional semiconductor layer, thus complicating the apparatus for making the same. Also, the semiconductor laser made by means of such a method does not seem to have a high reproducibility. Further, when an element identical to that contained in the active layer is introduced through the end face thereof, although the vicinity of the end face attains a higher resistivity, thus manufactured semiconductor laser may not sufficiently emit light for a long time with a high output in a continuous manner.

In order to overcome such problems, it is an object of the present invention to provide a semiconductor laser which can continuously emit light for a long time with a high output, and a method of making the same.

SUMMARY OF THE INVENTION

The method of making a semiconductor laser in accordance with the present invention is a method of making a semiconductor laser having an active layer comprising a GaAs based compound, the method comprising a step of substituting a part of the GaAs based system compound in regions of the active layer at and in the vicinity of both end faces of a resonator by nitrogen or phosphorus to yield a GaN or GaP based compound.

The GaN or GaP based compound has an energy band gap wider than that of the GaAs based compound. Accordingly, in the semiconductor laser made by this method, the end faces of the resonator have an energy band gap wider than that in the active layer therein. As a result, the resonator end face regions become so-called window regions which are transparent to the laser oscillating wavelength, thus failing to absorb laser light. Accordingly, the end faces can be prevented from deteriorating due to the absorption of laser light.

Examples of the GaAs based compound used in the active layer include GaAs, GaInAs, GaInAsP, GaInAsN, and the like. Examples of compounds obtained when these GaAs based compounds are substituted by nitrogen or phosphorus include GaN, GaP, GaInAsP, GaInAsN, and the like. When the element before the substitution is of a GaInAsN compound, the ratio of As element in the GaInAsN compound after the substitution lowers, thus increasing the ratio of nitrogen element and thereby broadening the energy band gap.

Further, this substituting step is preferably effected such that a mutual action between a magnetic field and a microwave is utilized to turn nitrogen or phosphorus element into plasma, with which both end faces of the resonator are irradiated. In this case, a high-quality compound layer is formed at each end face portion of the resonator.

The semiconductor made by such a method has an active layer comprising a GaAs based compound, while As element in the active layer at both end faces of the resonator is substituted by nitrogen or phosphorus element.

When the method of the present invention is used, it is possible to make a semiconductor laser which can improve its resistance to COD and can continuously emit light for a long time with a high output. Also, since this method can be easily performed as a part of a preparatory processing for forming a reflecting film, it is highly compatible with a typical semiconductor laser process and does not affect the productivity or manufacturing cost of the semiconductor laser.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

In the following, an embodiment of the semiconductor laser and method of making the same in accordance with the present invention will be explained with reference to the accompanying drawings. Here, elements identical to each other will be referred to with marks identical to each other, without their overlapping explanations being repeated.

Figure 1:
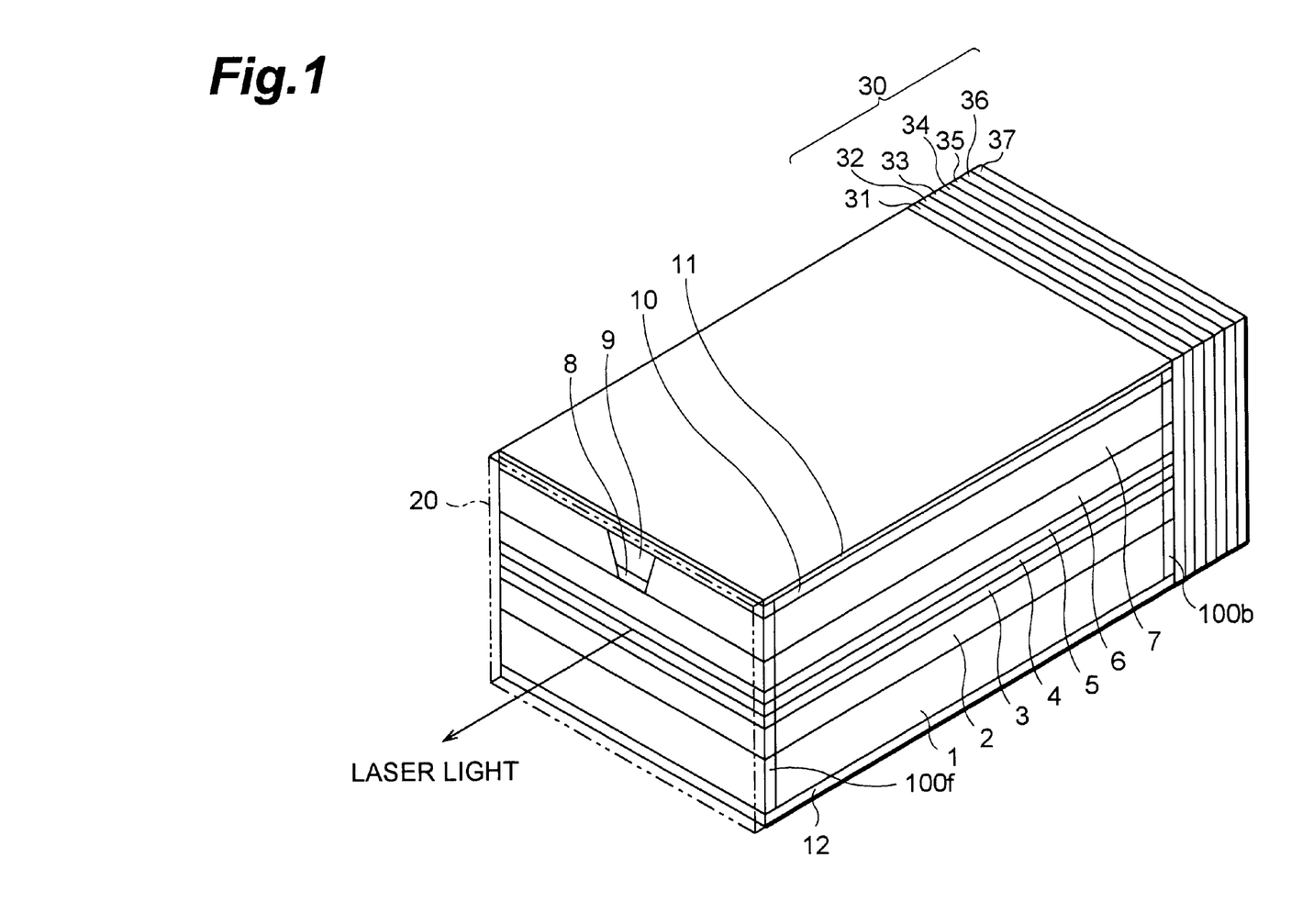
FIG. 1 is a perspective view showing a semiconductor laser in accordance with the present invention.

FIG. 1 is a perspective view showing the semiconductor laser in accordance with this embodiment. First, the configuration of this semiconductor laser will be explained. This semiconductor laser comprises a substrate 1, a lower cladding layer 2, a lower light-confining layer 3, an active layer 4, an upper light-confining layer 5, a first upper cladding layer 6, a wave guiding layer 8, a second upper cladding layer 9, and a contact layer 10, which are successively mounted in this order; and is able to emit laser light with a wavelength preferably within the range of 0.9 to 1.1 $\mu$m or specifically at 0.98 $\mu$m. Also, between the first upper cladding layer 6 and the contact layer 10, the semiconductor laser has a current blocking layer 7 divided by a groove extending in the longitudinal direction thereof. The wave guiding layer 8 and the second upper cladding layer 9 are embedded within the groove (hereinafter referred to as dividing groove) that divides the current blocking layer 7. Ohmic electrodes 11 and 12 are respectively formed at the upper face of the contact layer 10 and the lower face of the substrate 1.

The region of compound semiconductor layers 2 to 6 directly under the dividing groove and the layers 8 and 9 within the groove constitute a resonator, whereas end faces of these layers including both ends of the dividing groove in its longitudinal direction form reflecting end faces (crystal cleavage planes) at both ends of the resonator. Formed on the reflecting end face from which the laser light exits (hereinafter referred to as exit face) is a compound material 100ƒ having an energy band gap wider than that of the active layer 4. Formed on the surface of the compound material 100ƒ is an SiN reflection reducing film (hereinafter referred to as low reflecting film) 20. Formed on the reflecting end face (hereinafter referred to as high reflecting face) opposite to the exit face is a compound material 100b having an energy band gap wider than that of the active layer 4. Formed on the surface of the compound material 100b is a multilayer reflecting film 30. The multilayer reflecting film 30 is composed of a dielectric thin film 31, an amorphous Si film 32, a dielectric thin film 33, an amorphous Si film 34, a dielectric thin film 35, an amorphous Si film 36, and a dielectric thin film 37.

In the following, the material and the like of each constituent will be explained. The substrate 1 comprises an n-type GaAs and has a thickness of about 100 $\mu$m. The lower cladding layer 2 comprises an n-type GaInP and has a thickness preferably within the range of 1 to 2 $\mu$m or specifically of 1.5 $\mu$m. The lower light-confining layer 3 comprises an undoped GaInAsP and has a thickness preferably of several tens of nm or specifically of 47 nm. The active layer 4 comprises an undoped GaInAs and has a thickness preferably of several nanometers or specifically of 8 nm. The upper light-confining layer 5 comprises an undoped GaInAsP and has a thickness preferably of several tens of nm or specifically of 47 nm. The first upper cladding layer 6 comprises a p-type GaInP and has a thickness preferably within the range of 0.3 to 0.5 $\mu$m or specifically of 0.4 $\mu$m. The wave guiding layer 8 comprises a p-type GaAs and has a thickness preferably within the range of 10 to 30 nm or specifically of 15 nm. The second upper cladding layer 9 comprises a p-type GaInP and has a thickness preferably within the range of 1 to 2 $\mu$m or specifically of 1.1 $\mu$m. The contact layer 10 comprises a p-type GaAs. The current blocking layer 7 comprises an n-type AlGaInP and has a thickness substantially equal to that of the cladding layer 9. Each of the dielectric thin layers 31, 33, 35, and 37 comprises SiN. Here, as the material for the dielectric thin layers 20, 31, 33, 35, and 37, $SiO_2$ or $Al_2O_3$ may also be used in place of SiN. Both compound materials 100ƒ and 100b are GaN compound semiconductors containing Ga, In, As, and N. Here, the magnitude of energy band gap in each compound semiconductor layer is a value defined by its material.

In the following, operations of this semiconductor laser will be explained. When a voltage is applied between the upper and lower electrodes 11 and 12, thereby supplying a current, positive holes are injected into the region (active region) of the active layer 4 directly under the dividing groove from the side of the p-type semiconductor layer 6 thereabove, whereas electrons are injected into this region from the side of the n-type semiconductor layer 2 therebelow. When the density of thus injected carriers exceeds the minimum level required for creating a population inversion, the optical gain effected by the action of induced emission and the optical loss of the resonator equilibrate with each other, thereby initiating a laser action. The laser light generated within the active layer 4 is amplified while traveling to-and-fro between the reflecting end faces of the resonator, before being emitted from the exit end face on the side provided with the low reflecting film 20.

As explained above, this semiconductor laser has the active layer 4 for emitting the laser light from its end face; and a thin layer, disposed near the end face, containing nitrogen element, having an energy band gap wider than that of the active layer 4, and functioning as a window region transparent to the oscillated light.

Figure 2:
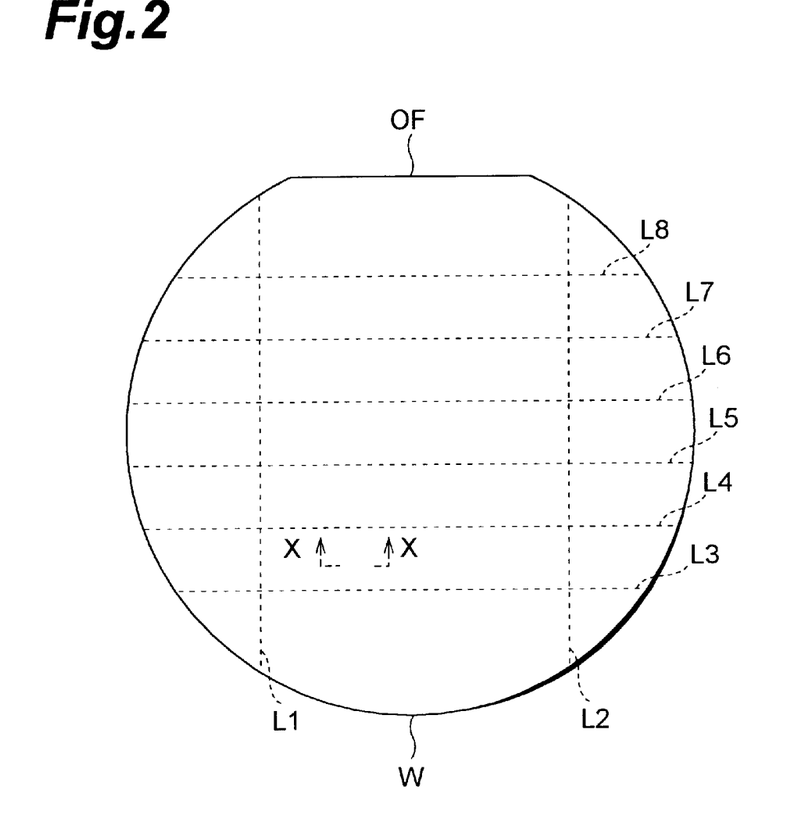
FIG. 2 is a plan view showing a wafer which becomes a material for the semiconductor laser shown in FIG. 1.

In the following, a method of making this semiconductor laser will be explained. FIG. 2 is a plan view of a wafer W constituting the substrate 1. This wafer W is a (100) GaAs wafer (JUST substrate) having a device-forming region surrounded by lines L1 and L2 perpendicular to an orientation flat OF and lines L3 and L8 in parallel to the orientation flat OF. In the device-forming region of the wafer W, a plurality of semiconductor lasers are manufactured. Initially manufactured from this wafer W is a chip bar composed of a plurality of columns of semiconductor laser intermediate products. Hereinafter, the method of making this chip bar will be explained with reference to the cross section of an area within this device-forming region in the wafer W where one semiconductor laser is formed. In the following explanation, the wafer W of FIG. 2 after a plurality of devices are formed thereon will also be referred to as the wafer W.

Figure 3:
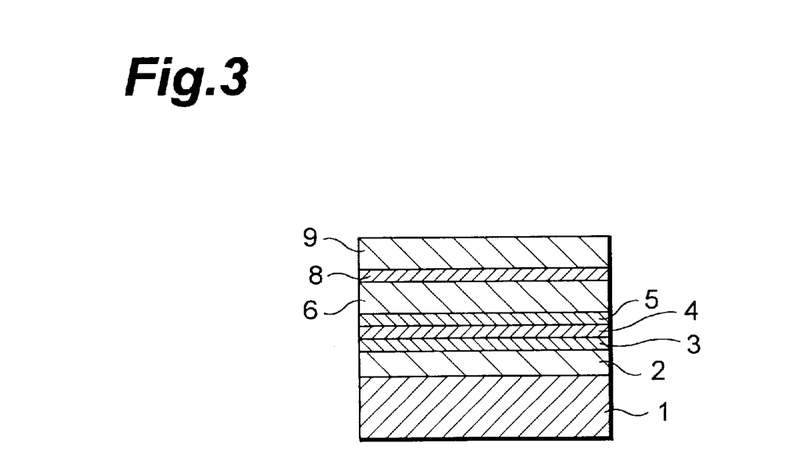
FIGS. 3 to 5 are sectional views showing intermediate products of the semiconductor laser shown in FIG. 1.

FIGS. 3 to 5 show semiconductor laser intermediate products in a cross section taken along line X—X of the wafer W in FIG. 2. The above-mentioned chip bar is manufactured by means of the following method. First, as shown in FIG. 3, on the substrate 1 (GaAs wafer W), the lower cladding layer 2, the lower light-confining layer 3, the active layer 4, the upper light-confining layer 5, the first upper cladding layer 6, the wave guiding layer 8, and the second upper cladding layer 9 are successively laminated. This laminating process is effected by means of an organic metal vapor phase epitaxial growth (OMVPE) technique.

Figure 4:
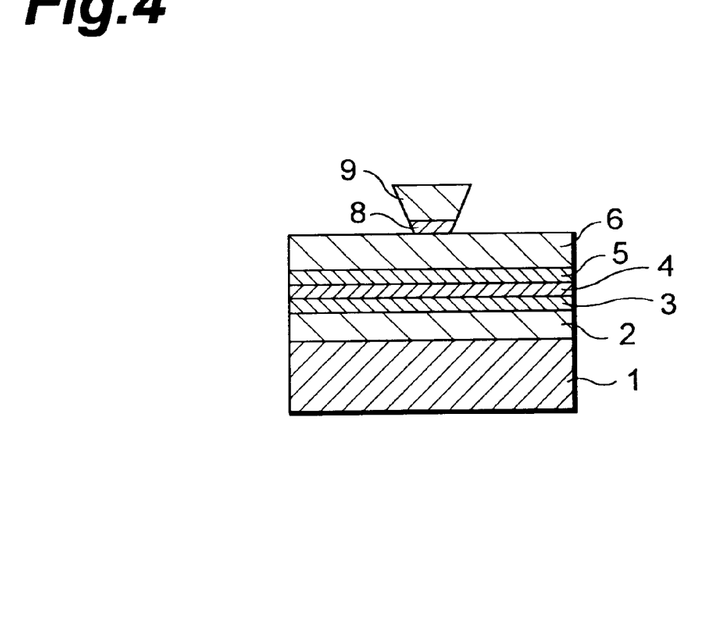

Subsequently, as shown in FIG. 4, masks are formed at predetermined areas on the second upper cladding layer 9 and wave guiding layer 8, so that these layers are successively etched. Namely, first, the exposed area of the second upper cladding layer 9 is wet-etched with an etchant into an inverted mesa form. Here, the inverted mesa form is attained due to the fact that the etching rate varies depending on the azimuth of crystal plane in the cladding layer 9. The concentration of the etchant is appropriately selected so as to enable such an etching process. During this etching process, the wave guiding layer 8 functions as an etching blocking layer, so that only the exposed area of the second upper cladding layer 9 located above the wave guiding layer 8 is selectively etched. Thereafter, the exposed area of the wave guiding layer 8 is etched with another etchant. During this etching process, the first upper cladding layer 6 directly under the wave guiding layer 8 functions as an etching blocking layer, so that only the exposed area of the wave guiding layer 8 is selectively etched.

Figure 5:
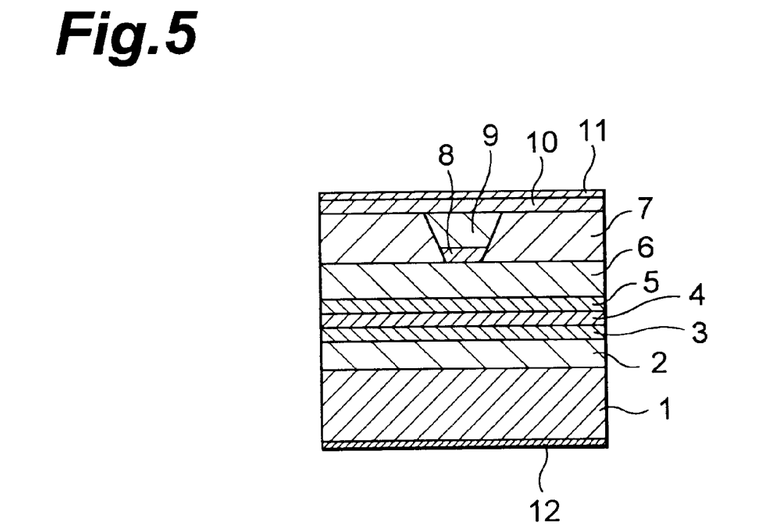

Then, as shown in FIG. 5, the current blocking layer 7 is formed on the first upper cladding layer 6 so as to cover the surfaces of the wave guiding layer 8 and second upper cladding layer 9 exposed by etching. The current blocking layer 7 is deposited to such an extent that the upper face thereof is made flush with the upper face of the second upper cladding layer 9. After the current blocking layer 7 is formed, the mask formed on the second upper cladding layer 9 is eliminated, and then the contact layer 10 is formed on the second upper cladding layer 9 and the current blocking layer 7. Thereafter, the electrodes 11 and 12 are respectively deposited on the exposed surfaces of the contact layer 10 and substrate 1. Finally, the wafer W shown in FIG. 2 is cleaved along the lines L1 to L8 coinciding with crystal azimuths, thereby making a chip bar.

Figure 6:
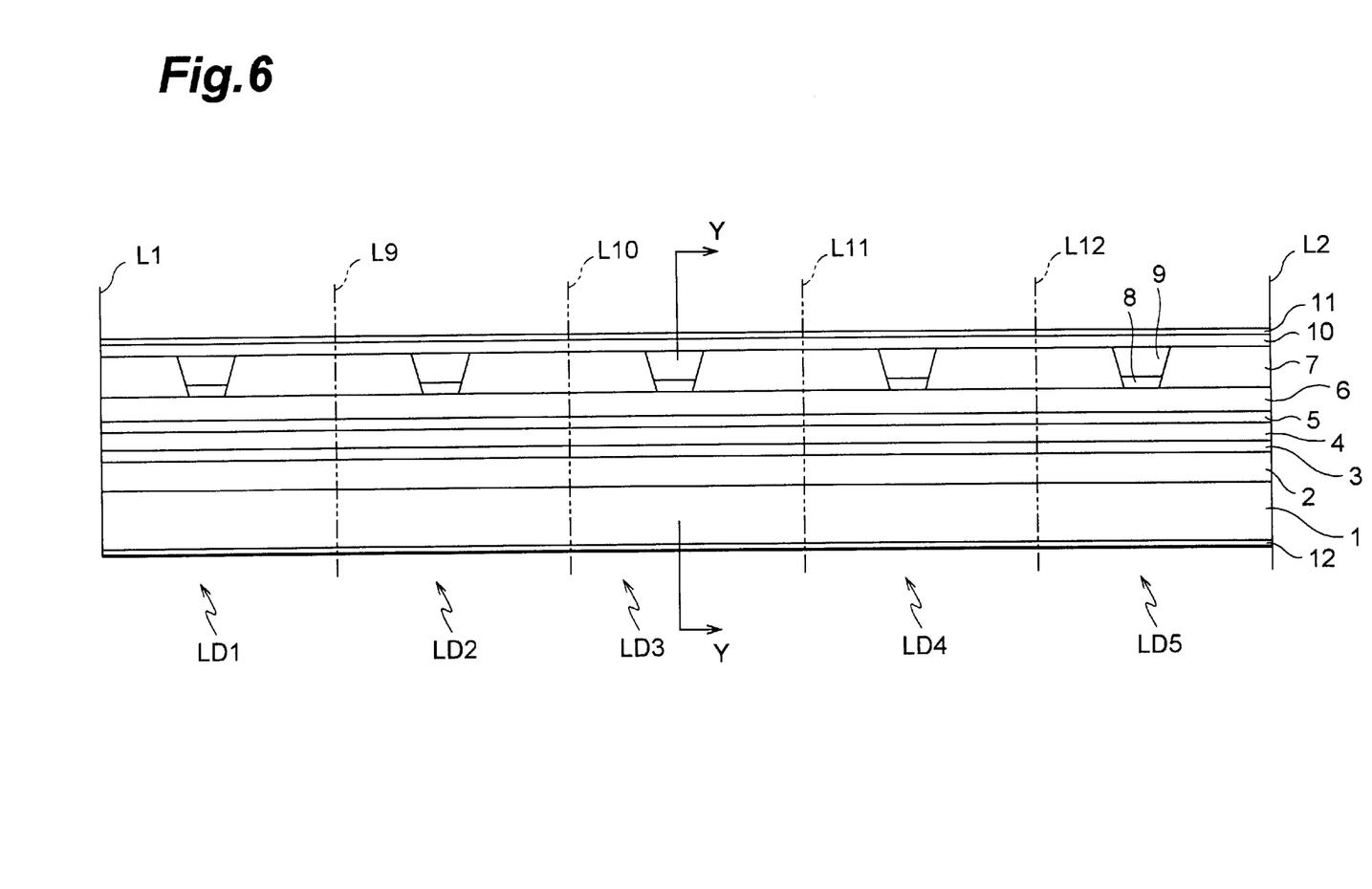
FIG. 6 is a front view showing a chip bar at the time when the semiconductor laser shown in FIG. 1 is being made.

FIG. 6 is a front view of this chip bar. The depicted chip bar is taken out from the region surrounded by the cleavage planes L1, L2, L3, and L4 in FIG. 2. As depicted, this chip bar comprises semiconductor laser intermediate products LD1 to LD5 with configurations identical to each other.

Figure 7:
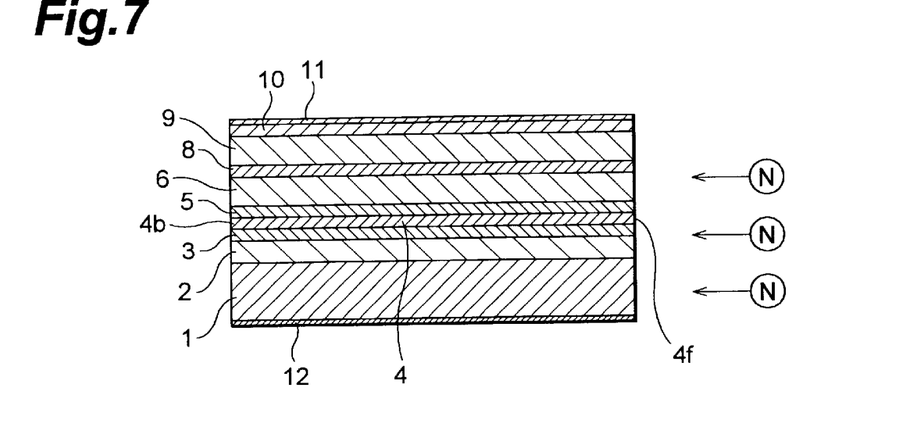
FIGS. 7 to 11 are sectional views showing the chip bar shown in FIG. 6.

In the following, the forming of the compound materials 100$f$ and 100$b$ and reflecting films 20 and 30 will be explained. FIG. 7 is a sectional view of the chip bar taken along line Y—Y of FIG. 6. First, from an exit face 4$f$, nitrogen atoms are introduced into the active layer 4 and the other semiconductor layers having common end faces.

Specifically, the chip bar shown in FIG. 7 is placed within a helicon plasma generator, which is then held at a vacuum of $1 \times 10^{-6}$ Torr, and a mixed gas of argon and nitrogen (with a mixing ratio of 1:1) is caused flow therein at a flow rate of 6 SCCM. Here, an RF electric power of 13.56 MHz is applied around its reaction chamber, and the processing is effected for about 3 hours with a plasma power of 260 W. As a result, the nitrogen gas is turned into plasma, with which the cleavage end faces of the chip are irradiated. During the processing, though the chip bar is not directly heated, its temperature reaches about 60° to 70° C. under the influence of the plasma irradiation. When the nitrogen atoms are thus introduced through the end face of the chip bar, a part of the active layer 4 in the vicinity of the exit face 4$f$ is changed into the compound semiconductor material 100$f$. Though the compound semiconductor material 100$f$ contains a small amount of As, the As atoms originated in the active layer 4 are essentially substituted by N atoms, whereby the compound semiconductor material 100$f$ is now mainly composed of GaInN. Since the Ar gas facilitates ionization of the nitrogen gas so as to increase the nitrogen plasma density, the nitriding of the end face is accelerated.

The nitrogen gas, which has long been used quite widely as a process gas in the fields of electronic industries, is advantageous in that it can be easily obtained with a high purity at a low cost. Accordingly, when the nitrogen gas is used, the nitriding process for the end face can be effected with a high purity at a low processing cost.

Though an example using, as a plasma irradiation technique, that of a helicon type is explained here, any technique, such as an ECR (electron cyclotron resonance) CVD technique, may be used as long as it can radiate plasma with a high purity and can radiate ions without damaging the semiconductor surfaces. These techniques utilizing a mutual action between a magnetic field and a microwave can introduce the nitrogen gas and the like into the semiconductor layers through the end face without damaging the vicinity of the end face. Further, since these techniques can be effected at a low temperature (several ten ° C.), no thermal damage is imparted to the inside of the semiconductor layers at the time of manufacture.

In the nitriding of the active layer 4 by this technique, it is presumed that Ga and N in the active layer 4 combine together to form a GaN compound semiconductor layer having a thickness of 10 to 20 nm. Since the above-mentioned technique is used, this compound semiconductor layer is a highly resistant layer having a sufficiently low surface level density. The GaN compound semiconductor layer 100$f$ having such a favorable quality is expected to lower the current leaking to its end face 14$f$, reduce the nonradiative recombination centers in its interface with the reflecting film 20, and prevents the COD degradation from occurring. Further, since this semiconductor layer 100$f$ has an energy band gap wider than that of the active layer 4, it functions as a window region transparent to the wavelength of the emitted laser light. Due to their synergistic effects, the COD degradation can be dramatically suppressed.

Figure 8:
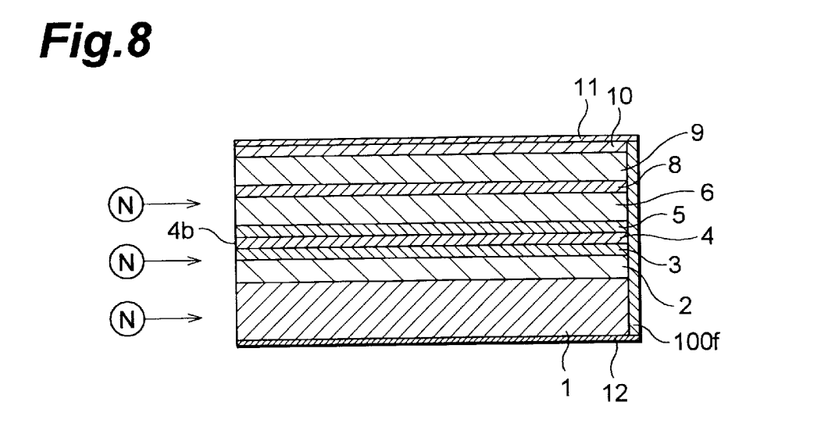

FIG. 8 is a sectional view, taken along line Y—Y, of the chip bar provided with the compound material 100$f$. After the compound material 100$f$ is formed, nitrogen atoms are introduced into the active layer 4 from the side of an end face 4$b$ which is opposite to the exit face 4$f$ of the active layer 4. This introducing step will not be explained here, since it is the same as that for forming the compound material 100$f$.

Figure 9:
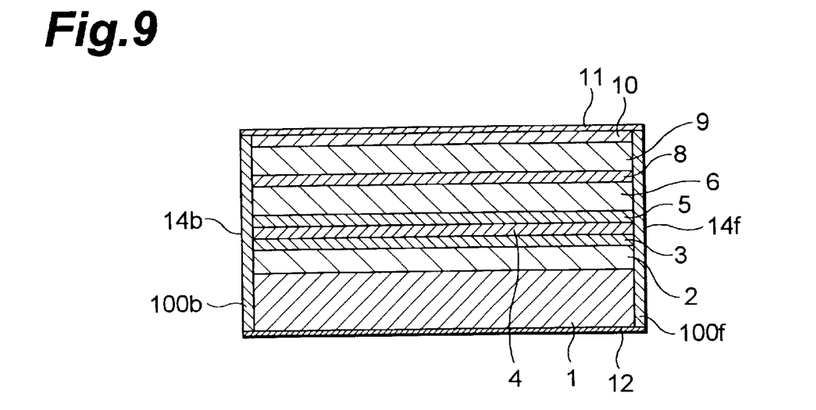

FIG. 9 is a sectional view, taken along line Y—Y, of the chip bar whose both end faces are respectively provided with the compound materials 100$f$ and 100$b$. After these materials 100$f$ and 100$b$ are formed, the helicon plasma generator is used to form the reflecting film 20 on the exit face 14$f$ of the compound material 100$f$. Namely, the SiN reflecting film 20 having a thickness of 100 nm or greater is formed on the exit face 14f.

Figure 10:
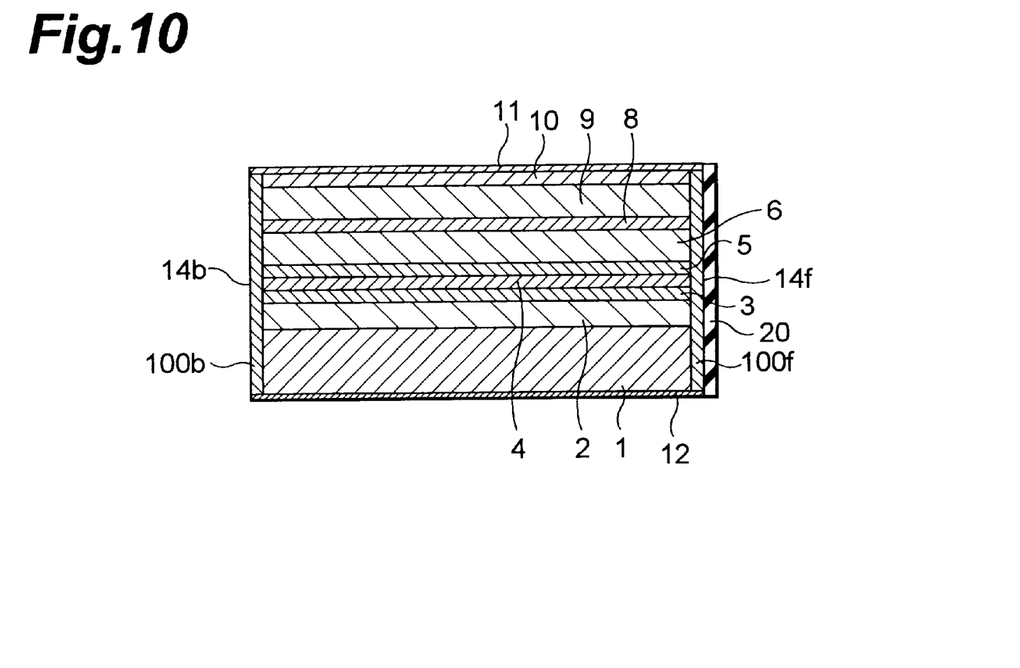
Figure 11:
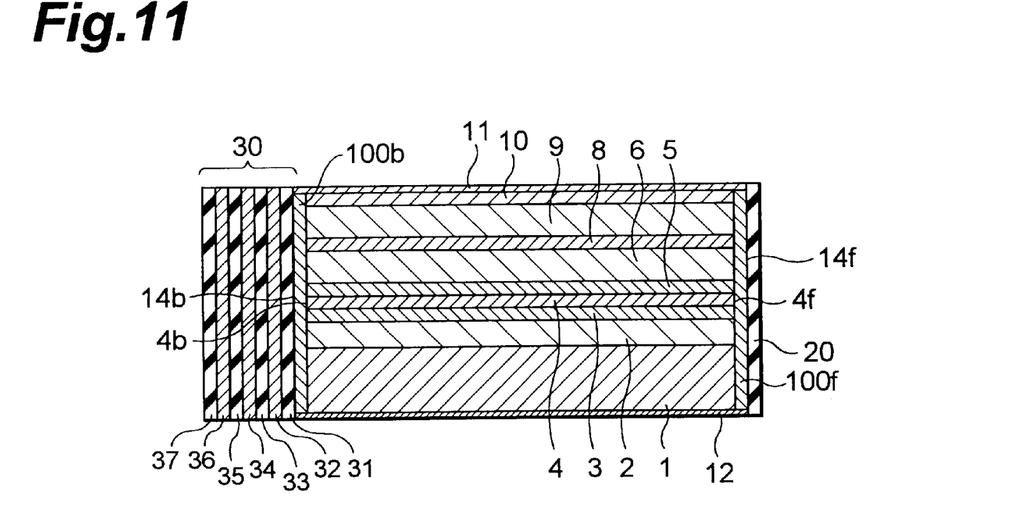

FIG. 10 is a sectional view, taken along line Y—Y, of the chip bar provided with the reflecting layer 20. Thus formed reflecting film 20 has a reflectivity preferably of not greater than 10% or specifically of 3% with respect to the laser light having a wavelength of 0.98 μm. Then, the plasma generator is used to form the reflecting film 30 on a high reflecting face 14b of the compound material 100b. Namely, on the reflecting face 14b, 4 layers of SiN films and 3 layers of amorphous Si layers are alternately laminated. As a result of this step, a chip bar comprising a plurality of semiconductor lasers is formed. FIG. 11 is a sectional view, taken along line Y—Y, of the chip bar provided with thus completed semiconductor lasers. Thus formed reflecting film 30 has a reflectivity preferably of not smaller than 90% or specifically of 93% with respect to the laser light having a wavelength of 0.98 μm.

Finally, the respective semiconductor lasers LD1 to LD5 are separated from each other along the cleavage planes L9 to L12 shown in FIG. 6, whereby the semiconductor laser shown in FIG. 1 is made.

In the following, a semiconductor laser in accordance with another embodiment and a method of making the same will be explained. The configuration of this semiconductor laser is the same as that shown in FIG. 1 except for the material of the compound materials 100f and 100b. Namely, in this embodiment, the material of the compound materials 100f and 100b is GaInAsP. Here, in the explanation, even when the ratio of constitutent elements in the above-mentioned compound semiconductor varies, e.g., in the case of $GaInAs_xP_{1-x}$ ($0 \leq x < 1$), it is simply expressed as GaInAsP. GaInAsP also has an energy band gap wider than that of GaInAs, thereby functioning as a window with respect to the wavelength of the emitted laser light.

In the following, the method of making this semiconductor laser will be explained. This method differs from the method of the foregoing embodiment only in the kind of element introduced into the active layer 4 through the end faces 4f and 4b. Namely, in this method, phosphorus atoms are introduced into the active layer 4 and the other semiconductor layers having common end faces. Though the plasma generator identical to that mentioned above may be used for introducing the element, an embodiment using a typical parallel plate plasma generator will be explained here.

The cleaved chip bar shown in FIG. 7 is placed within the parallel plate plasma generator, which is then vacuumed to its base vacuum of $1 \times 10^{-2}$ Torr. Thereafter, a $PH_3$ gas diluted with hydrogen (having a concentration of 10%) is caused to flow therein at 12 SCCM. After the substrate holding the chip bar is heated to 250° C., the chip bar is processed for about 1 hour at a vacuum of 0.2 Torr and a plasma power density of 0.18 W/cm². The frequency at the RF power of this apparatus is 13.56 MHz.

By this processing, a part or all of the As atoms in the vicinity of the end faces 4f and 4b of the active layer 4 are substituted by P atoms, whereby the compound materials 100f and 100b comprising GaInAsP are formed. Thus obtained GaInAsP layer functions as a so-called window region having an energy band gap wider than that of the active layer 4. Accordingly, light absorption at the end faces is suppressed, and their resistance to COD is dramatically improved. Further, in this method, since the end faces 4f and 4b are passivated with P and H, the surface level of the end faces is greatly lowered, thus effectively contributing to the prevention of COD degradation as well.

Also, the $PH_3$ gas, whose refining technique has long been developed as a material gas used for the organic metal vapor phase epitaxial growth (OMVPE) method, can easily be obtained with a high purity at a low cost and can simultaneously generate P and H which are effective for passivating. Accordingly, when the $PH_3$ gas is used, a phosphorus and hydrogen processing for the end faces can be effected with a high purity and high efficiency at a low cost. Further, upon this plasma irradiation, surface defects such as As-vacancy can be filled with P atoms, the addition of P atoms restrains free As atoms, which cause the surface level formation, from being formed, and hydrogen plasma cleans the end faces so as to make them passivated, thus further reducing the surface defects. Also, defects caused by P-vacancy generated upon this plasma processing are passivated with P plasma, whereby the surface level can further be lowered. In the case where plasmas of P and H are radiated together, defects with a deep level can be prevented from occurring even upon a high-temperature annealing after the plasma radiation. Here, the reflecting films 20 and 30 may be formed by means of either typical CVD technique or sputtering technique.

In this method, though the substrate on which a sample is mounted must be held at a temperature higher than that in the case of the helicon plasma generator for the above-mentioned nitriding processing, the thermal damage imparted to the semiconductor laser at such a temperature is so little that it is not problematic at all. Though no plasma generation is effected by a magnetic field here, as with the above-mentioned nitriding processing, a mutual action between a magnetic field and a microwave may be utilized for effecting the processing.

As explained in the foregoing, in this method, an element not contained in the compound semiconductor layer 4 is introduced therein through the end face 4f thereof, whereby the region of the compound semiconductor layer 4 in the vicinity of the end face 4f is changed into the compound material 100f containing this element, having an energy band gap wider than that of the compound semiconductor layer 4, and emitting therethrough laser light generated within the compound semiconductor layer 4. Though GaInAs is used as the material of the active layer 4 in the semiconductor laser in accordance with the present invention, GaAs, GaInP, AlGaInP, GaInAsP, GaInAsN, or the like may be used instead. Also, though GaInP is used as the material of the cladding layers 2 and 6 in the semiconductor laser in accordance with the present invention, AlGaInP, AlGaAs, or the like may be used instead. Further, the above-mentioned introduction of element is preferably effected such that a mutual action between a magnetic field and a microwave is utilized to turn the element into plasma. As the active layer 4, a kind of GaInAsP having an energy band gap narrower than that of GaInAsP formed in the vicinity of the end face may also be employed.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No.8-237023 (237023/1996) filed on Sep. 6, 1996 is hereby incorporated by reference.

What is claimed is:

1. A semiconductor laser having a pair of end faces and a resonator defined by said pair of end faces, said laser comprising:

an active layer for said resonator having a GaAs based compound; and a GaN or GaP based compound at said pair of end faces, wherein said GaN or GaP based compound is formed by irradiation with plasma containing N or P element so as to substitute N or P element for As element in said GaAs based compound.

2. A method of making a semiconductor laser having an active layer comprising a GaAs based compound, comprising:

providing a semiconductor laser having an active layer comprising a GaAs based compound;

producing plasma including N or P element with an interaction between a magnetic field and a microwave;

irradiating both end faces of a resonator in said active layer with said plasma; and substituting N or P element for As element in said GaAs based compound at both end faces of a resonator.

* * * * *